United States Patent [19]
Jones

[11] Patent Number: 5,138,527
[45] Date of Patent: Aug. 11, 1992

[54] EQUIPMENT CONTROL PANEL STRUCTURE
[75] Inventor: Theodore L. Jones, Akron, Pa.
[73] Assignee: Burle Technologies, Inc., Wilmington, Del.
[21] Appl. No.: 726,687
[22] Filed: Jul. 8, 1991
[51] Int. Cl.$^5$ .............................................. H05K 5/00
[52] U.S. Cl. ..................... 361/399; 174/67; 361/429
[58] Field of Search ............ 174/67; 206/334; 220/4.28, 625; 292/DIG. 31, DIG. 53; 361/390–395, 399, 413, 415, 429

[56] References Cited

U.S. PATENT DOCUMENTS

| | | | |
|---|---|---|---|
| 4,101,871 | 7/1978 | Oliveira | 455/128 |
| 4,471,493 | 9/1984 | Schober | 455/128 |
| 4,662,531 | 5/1987 | Ramspacher et al. | 312/7.1 |
| 4,867,398 | 9/1989 | Butcher et al. | 312/7.1 |
| 4,874,110 | 10/1989 | Klein et al. | 312/7.1 |
| 4,908,738 | 3/1990 | Kobari et al. | 361/429 |
| 4,912,602 | 3/1990 | Zurek et al. | 455/128 |
| 4,963,876 | 10/1990 | Sanders et al. | 455/128 |

FOREIGN PATENT DOCUMENTS

| | | | |
|---|---|---|---|
| 0384670 | 11/1964 | Switzerland | 174/66 |
| 1471326 | 4/1989 | Switzerland | 361/399 |

*Primary Examiner*—Leo P. Picard
*Assistant Examiner*—Donald A. Sparks
*Attorney, Agent, or Firm*—Martin Fruitman

[57] ABSTRACT

A control panel structure for electronic equipment. The structure comprises multiple layers in which an electronic chassis has attached to it, in sequence, a bezel, a PC board which fits into a cutout on the bezel, a cover inset to align and lock the other parts together, and an adhesive backed overlay to furnish labels and decorative features. The assembly is held together by split bosses extending back from the bezel. The bosses fit into holes in the chassis, with the bosses expanded so that they fit tightly into the holes by alignment pegs which extend back from the cover inset and fit tightly into the bosses.

10 Claims, 2 Drawing Sheets

EQUIPMENT CONTROL PANEL STRUCTURE

SUMMARY OF THE INVENTION

This invention deals generally with cabinets or housings for electronic equipment and more specifically with a control panel structure for electronic equipment.

Although electronic circuit board assembly has been greatly simplified and is now usually accomplished by automated machines, the techniques of electronic equipment control panel assembly seemed to have remained much more complex and less susceptible to automation. Adhesives, screws and rivets are still prevalent in assembling control panels, even though such multiple part assemblies make automatic machine assembly much more difficult. Although some units are also available with spring type latches or clips, these are generally used only when later disassembly is required, because such devices add complexity and cost to the apparatus.

The problem with the assmebly of control panels is that such panels have greater design constraints than typical circuit boards, in that they must be aligned with considerable accuracy, since they usually include indicators such as lamps or LEDs and mechanical devices such as switches, all of which must be accurately spaced and still interconnected with the other circuits in the equipment. Moreover, control panels also must be designed and assembled with aesthetic considerations in mind.

Typically, these requirements are met by simply mounting an independent panel, using locating pins, screws and adhesives to hold the panel in place and connecting it into the circuit with flexible wiring. However, this technique is slow and frequently requires costly manual operations.

The present invention offers a new approach to control panel design. Using multiple layers to virtually build the control panel in place upon the electronic chassis, it, nevertheless, uses simple structures which are very susceptible to automatic machine assembly. The present invention uses no separate screws or other fasteners, requires only relatively simple and inexpensive tooling for implementation, can be disassembled if necessary, and uses an inexpensive adhesive backed overlay to furnish attractive aesthetic apperance and the required labels for controls.

Furthermore, the invention permits the use of one basic part to attach many variations of controls to different circuit boards, and also serves as the mounting system for the circuit board associated with the controls.

The structure of the invention includes four subassemblies which are assembled onto a planar surface of the chassis that, after assembly, will be located behind the completed control panel and will furnish mechanical support for the control panel.

The first of these subassemblies is a bezel which is located in contact with the chassis surface. The bezel is essentially a frame structure which generally follows the perimeter of the chassis surface to which it is attached, and the bezel has sufficient depth to permit the other subassemblies to fit within its perimeter frame elements. The bezel also has split bosses protruding from its rear surface. In the preferred embodiment, these bosses are essentially split cylinders, each with a through hole in the center, and these bosses fit through matching holes in the chassis surface to which the bezel attaches. The through hole in each boss is tapered so that the part of the hold which is located in the end of the boss which protrudes beyond the chassis surface is smaller than the other end of the hole.

Each boss also includes a chassis seating surface, a step, located along its length. This step is a discontinuity in the outside cross sectional dimension of the boss so that the portion of the boss most remote from the chassis hole into which the boss fits is larger than the portion of the boss within the chassis hole. The result of this configuration is that when the boss is inserted into the chassis hole, the step stops the boss in a position so that a portion of the boss does not go into the chassis hole, and the rear surface of the bezel to which the bosses are attached therefore remains spaced away from the chassis. This spacing is determined by the locations of the steps on the bosses.

The second subassembly is a circuit board which includes all the active elements of the control panel. Such elements include lamps, LEDs, and switches of all types, including rocker switches and joystick configurations. The circuit board subassembly fits within the perimeter frame of the bezel, and its location can thus be accurately controlled. It can therefore be constructed so that, as it is inserted into the bezel, its connectors will automatically mate with matching connectors mounted on the chassis surface.

The third subassembly is a cover insert which also fits within the bezel, essentially covering the circuit board and clamping it within the bezel. The cover insert includes holes in its surface which match the locations of the elements on the circuit board, so that the elements of the circuit board are accurately located relative to the cover insert holes, permanently held in place and protrude through the cover insert if they are active controls. The cover insert can also include transparent windows for indicator lights.

The cover insert also includes the means for locking all the subassemblies onto the chassis. Protruding from the cover insert back surface are pegs which exactly line up with the tapered holes in the split bosses on the bezel. Therefore, when the cover insert is inserted into the bezel, the tight clearance pegs fit into the bosses and expand the bosses so that the bosses are mechanically trapped within the holes in the chassis surface.

The accurate location of the cover insert's pegs relative to the bezel's bosses also serves to align all the components. As noted avove, the circuit board elements are located and held in place by their matching holes in the cover insert. Moreover, since the pegs of the cover insert are constructed as close fits with the inside surfaces of the holes in the bosses of the bezel, and the bezel is itself located by its bosses inserted into the holes of the chassis surface, the cover insert and bezel together accurately locate the circuit board elements relative to the chassis surface.

The final addition to the assembly is an adhesive backed overlay. This is placed on the outside surface of the cover insert, and includes all necessary labels and decorative items. The overlay can also add to the versatility of the assembly, because it can cover unused holes in the cover insert. Therefore, a single cover insert can serve for more than one control panel assembly. For instance, two different switch locations can be anticipated with holes in the cover insert, and either one can be used by covering the unused hole with the overlay.

A distinct advantage of the cotnrol panel structure described is that all assembly operations take place from a single direction. This feature permits the assembly to be easily automated. Another advantage is that, if it should be required, the assembly can be dismantled without damage by pushing the pegs of the cover insert out of the bosses on the bezel.

The present invention therefore furnishes a highly versatile automatically assembled control panel structure, with accurate component alignment, which is capable of using multiple parts, and can even be disassembled if repair is necessary.

DETAILED DESCRIPTION OF THE INVENTION

Figure 1:
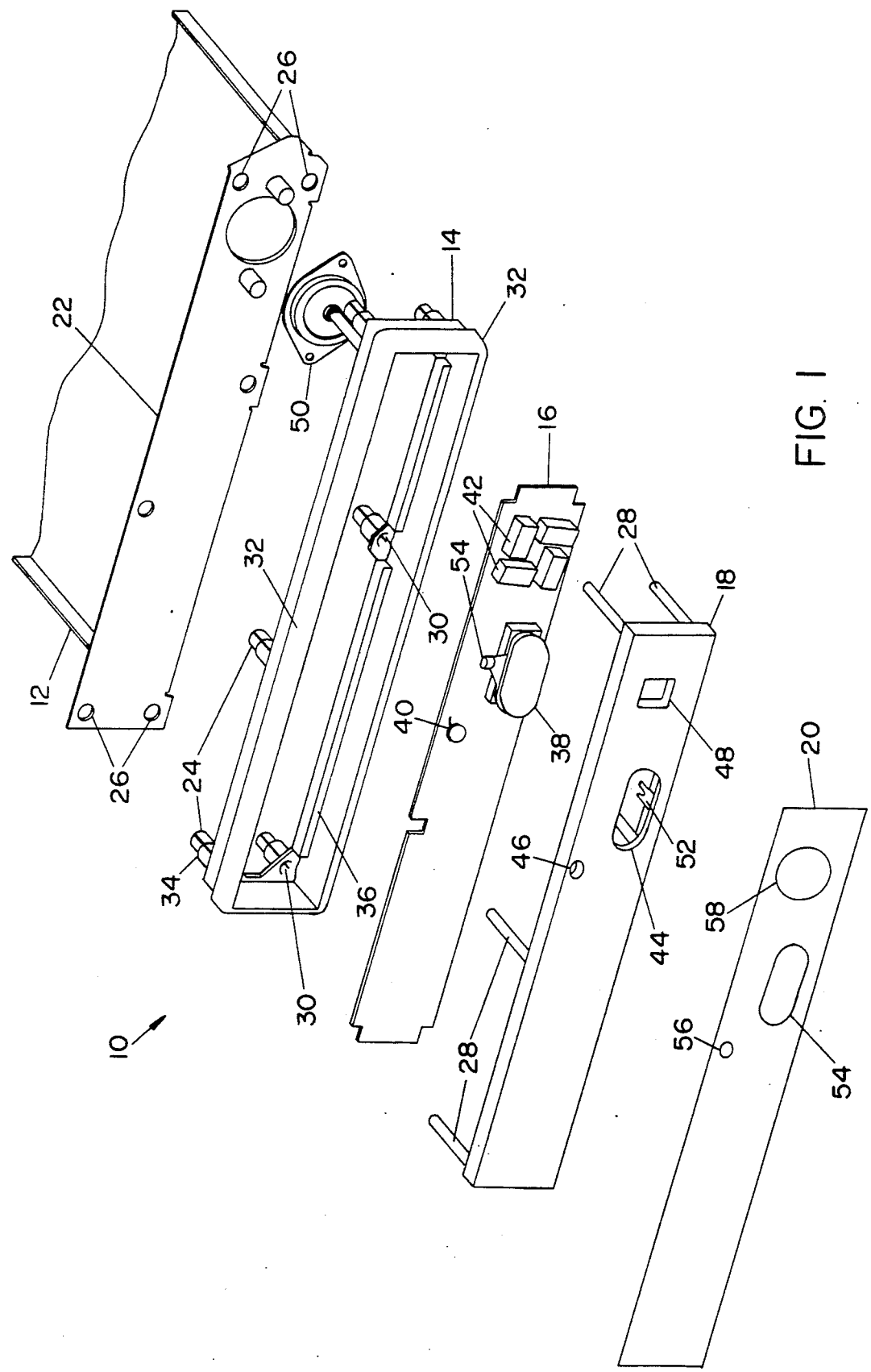
FIG. 1 is an exploded perspective view of the preferred embodiment of the control panel structure of the invention.

FIG. 1 shows an exploded view of control panel structure 10 in which chassis 12 supports assembled control panel 10 which is itself comprised of four subassemblies; bezel 14, circuit board 16, cover insert 18 and overlay 20.

Control panel 10 is designed to be attached to vertical surface 22 of chassis 12 in order to serve as a front panel, but the structure is not limited to front panel use and could also be used for top or rear panels and, in fact, any structure which requires attachment to a planar surface.

The basic premise of the panel structure is that bezel 14 includes one or more split sided bosses 24 extending from it which are inserted into holes 26 withoin surface 22. In the preferred embodiment shown in FIG. 1 these bosses are cylindrical in cross section, but that is not a limitation on their design. Bossis 24 could also have square or rectangular cross sections.

Pegs 28, extending from cover insert 18, are then inserted into tapered, minimum holes 30 within bosses 24 thereby causing bosses 24 to expand and lock the bosses into holes 26, thus locking bezel 14 and cover insert 18 onto panel 22 of chassis 12. It is advantageous if pegs 28 extend beyond the ends of bosses 24 when they are inserted into bosses 24, because this permits easy disassembly by simply pushing the ends of pegs 28 back into and out the other end of bosses 24. In order to create a functioning electronic assembly, circuit board 16 is sandwiched between bezel 14 and cover insert 18, and is therefore also held tightly in place without any need for mechanical fasteners or adhesives to contact circuit board 16.

Bezel 14 also fulfills the traditional function of a bezel in that it has sufficient depth of its framing elements 32, which generally follow the perimeter of chassis panel 22, so that, when assembled, framing elements 32 of bezel 14 will hide the edges of chassis panel 22 and extend beyond the surfaces of cover insert 18 and overlay 20 which are inserted into bezel 14.

Figure 2:
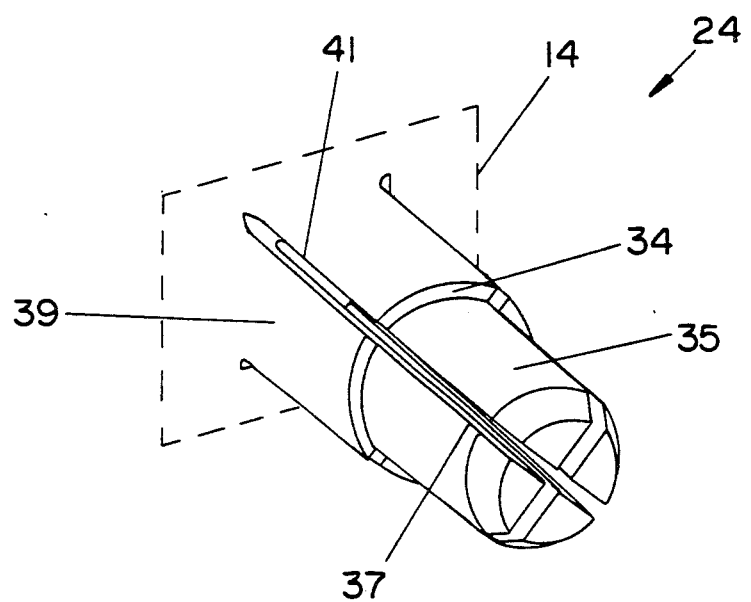
FIG. 2 is a perspective view of a boss of the preferred embodiment.

As shown in FIG. 2, split bosses 24 of the preferred embodiment are essentially cylindrical and extend perpendicularly from one surface of bezel 14. Bosses 24 are sized to insert into holes 26 in panel 22 (FIG. 1), and can also include steps 34 which act as stops to determine proper clearance between bezel 14 and panel 12. It is also desirable to keep the clearance between holes 26 in panel 22 (FIG. 1) and the smaller cross section portion 35 of cylindrical bezel 24 tight, because this increases the locking action when portion 35 of boss 24 is expanded. It should be appreciated that although only the portion of split 37 within smaller cross section boss portion 35 furnishes the locking action, extensions 41 of splits 37 which are in larger cross section portion 39 of boss 24 also serve a special purpose. Extensions 41 permit the distances between the outer surfaces of several bosses to vary sufficiently to accomodate variations in tolerances between the location of the bosses and the location of the holes in the chassis.

As seen in FIG. 1, bezel 14 also may include inside stops, such as bottom stop 36, which acts to determine the depth to which circuit board 16 inserts into bezel 14, and thereby also determines the clearance between circuit board 16 and chassis panel 12.

Circuit board 16, which is inserted into bezel 14 between frame members 32 after bezel bosses 24 are inserted into holes 26 of panel 22, contains the active electronic elements of control panel 10, such as rocker switch 38, LED 40 and joystick switch unit 42. It also includes conventional connector means (not shown) on its surface facing chassis panel 22, so that the connector means can mate with matching connector means (not shown) on chassis panel 22 when circuit board 16 is inserted into bezel 14. It should be appreciated that circuit board 16 need not be located precisely during assembly, because it will eventually be located and held in place by cover insert 18. Therefore, there is no need for any adhesives, screws or other attachment devices on circuit board 16.

Cover insert 18 functions both to locate the control panel components and to lock all the subassemblies in place. It includes holes, 44, 46 and 48 which fit around and properly align rocker switch 38, LED 40 and joystick control 50, respectively. It also includes alignment pin 52 which fits around rocker switch 54 to prevent movement of rocker switch 38 during operation. Therefore, when pegs 28 are pushed into bosses 24 as insert 18 is moved into bezel 14, the several holes in insert 18 fit around the components on circuit board 16 and perform all the necessary alignment functions for circuit board 16. The gripping action of bosses 24 around pegs 28 not only holds insert 18 firmly in the assembly, but also retains all the circuit board components in accurate positions. All that is required to finish the assembly of control panel 10 is the attachment of overlay 20. Overlay 20 is a simple thin cover sheet with adhesive backing on the surface facing insert 18, and it also includes hole 54 for rocker switch 38, hole 56 for LED 40 and hole 58 for joystick control 50. Along with these holes through which the components may be seen or operated, overlay 20 may also include any required labels for the components, and it also can serve the purpose of covering up any holes or other features which are not intended to be seen.

It should be appreciated that all the assembly motions; the insertion of bosses 24 into holes 26, the insertion of circuit board 16 into bezel 14, the insertion of insert 18 into bezel 14, and the application of overlay 20 are all accomplished from a single direction. This means that all these motions can easily be done by machine without complex motions. The assembly of control panel 10 is therefore very easily automated.

Moreover, the several subassemblies of control panel 10; bezel 14, circuit board 16, cover insert 18, and overlay 20 may all be constructed out of inexpensive, conventional materials by the use of simple, conventional tooling. To further simplify assembly, there is no requirement for additional parts such as screws or other fasteners.

The present invention therefore furnishes a unique control panel structure which is not only mechanically strong and secure but is also inexpensive to construct and assemble.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, overlay 20 may also include transparent portions through which indicators may be viewed, or even include fiber optic sections to transmit light from light sources mounted far back on chassis 12. Furthermore, bosses 24 need not include either steps 34 or split extensions 41, if the function of those parts are provided by other means.

What is claimed as new and for which Leters patent of the United States is desired to be secured is:

1. A control panel structure comprising;
a support structure with at least one through hole in part of its structure; a bezel comprising a frame which follows the perimeter of the support structure and covers the edges of the support structure, the bezel including at least one split boss attached to and protruding perpendicularly from the bezel, the boss protruding through a through hole in the support structure, with the boss including a tapered opening, with the smaller end of the tapered opening being located in the portion of the boss which protrudes through the through hole in the support structure;
a circuit board comprising a surface which fits within the frame of the bezel; and
a cover insert comprising a surface which fits within the frame and covers at least some portion of the circuit board, the cover insert including a peg protruding perpendicularly from the cover insert and into the tapered opening of the boss to expand the boss and lock the boss into the through hole in the support structure.

2. The control panel structure of claim 1 further including an overlay attached to the cover insert upon a surface of the cover insert not in contact with the circuit board.

3. The control panel structure of claim 1 further including components attached to the circuit board and protruding in the direction of the cover insert with the cover insert including through holes through which the components attached to the circuit board protrude.

4. The control panel structure of claim 2 further including components attached to the circuit board and protruding in the direction of the cover insert with the cover insert and the overlay including through holes through which the components attached to the circuit board protrude.

5. The control panel structure of claim 1 further including components attached to the circuit board and protruding in the direction of the cover insert with the cover insert including a capture device to locate and lock in place the components attached to the circuit board.

6. The control panel structure of claim 1 wherein a split boss is cylindrical in configuration.

7. The control panel structure of claim 1 wherein a split boss includes a step discontinuity in its outer surface, with the step acting to stop the insertion of the boss into the through hole in the support structure and thereby determine the spacing between the support structure and the bezel.

8. The control panel structure of claim 1 wherein a split boss is configured so that the portion of the boss nearest to the bezel has a larger outside dimension than the portion of the boss extending through the support structure.

9. The control panel structure of claim 1 wherein a split boss includes splits which extend into the portion of the boss which does not extend through the support structure.

10. The control panel structure of claim 1 wherein the peg protruding from the cover insert is of sufficient length of extend beyond the ends of the boss when fully installed in the boss.

* * * * *